United States Patent
Kim et al.

(10) Patent No.: US 9,890,238 B2
(45) Date of Patent: Feb. 13, 2018

(54) CURING CATALYST FOR EPOXY RESIN COMPOSITION, EPOXY RESIN COMPOSITION COMPRISING SAME, AND APPARATUS MANUFACTURED BY USING SAME

(71) Applicant: SAMSUNG SDI CO., LTD., Yongin-si, Gyeonggi-do (KR)

(72) Inventors: Jung Seob Kim, Uiwang-si (KR); Min Gyum Kim, Uiwang-si (KR); Dong Hwan Lee, Uiwang-si (KR); Jin Min Cheon, Uiwang-si (KR); Hwan Sung Cheon, Uiwang-si (KR); Seung Han, Uiwang-si (KR)

(73) Assignee: Samsung SDI Co., Ltd., Yongin-si, Gyeonggi-do (KR)

( * ) Notice: Subject to any disclaimer, the term of this patent is extended or adjusted under 35 U.S.C. 154(b) by 35 days.

(21) Appl. No.: 15/111,348

(22) PCT Filed: May 16, 2014

(86) PCT No.: PCT/KR2014/004428
§ 371 (c)(1),
(2) Date: Jul. 13, 2016

(87) PCT Pub. No.: WO2015/108248
PCT Pub. Date: Jul. 23, 2015

(65) Prior Publication Data
US 2016/0326303 A1 Nov. 10, 2016

(30) Foreign Application Priority Data

Jan. 14, 2014 (KR) ........................ 10-2014-0004796

(51) Int. Cl.
| | | |
|---|---|---|
| *C07D 401/00* | (2006.01) |
| *C07D 421/00* | (2006.01) |
| *C07D 213/72* | (2006.01) |
| *C07C 381/00* | (2006.01) |
| *C08G 59/68* | (2006.01) |
| *C09K 3/10* | (2006.01) |
| *C08K 3/00* | (2006.01) |
| *H01L 23/29* | (2006.01) |

(52) U.S. Cl.
CPC ......... *C08G 59/687* (2013.01); *C08G 59/686* (2013.01); *C08K 3/0033* (2013.01); *C09K 3/1006* (2013.01); *H01L 23/293* (2013.01); *H01L 23/295* (2013.01)

(58) Field of Classification Search
CPC .. C08G 59/687; C08G 59/686; C09K 3/1006; C08K 3/0033; H01L 23/295; H01L 23/293
USPC ............................... 546/268.1, 304; 560/303
See application file for complete search history.

(56) References Cited

U.S. PATENT DOCUMENTS 5,420,223 A   5/1995   Johnson

FOREIGN PATENT DOCUMENTS

| KR | 2000-0024875 A | 5/2000 |
| KR | 10-2009-0033226 A | 4/2009 |
| KR | 10-2013-0103307 A | 9/2013 |
| KR | 10-2013-0140036 A | 12/2013 |

*Primary Examiner* — David T Karst
(74) *Attorney, Agent, or Firm* — Lee & Morse, P.C.

(57) ABSTRACT

The present invention relates to a curing catalyst for an epoxy resin composition represented by chemical formula 1, an epoxy resin composition comprising the same, and an apparatus manufactured using the same.

9 Claims, No Drawings

CURING CATALYST FOR EPOXY RESIN COMPOSITION, EPOXY RESIN COMPOSITION COMPRISING SAME, AND APPARATUS MANUFACTURED BY USING SAME

CROSS REFERENCE TO RELATED APPLICATIONS

This is the U.S. national phase application based on PCT Application No. PCT/KR2014/004428, filed May 16, 2014, which is based on Korean Patent Application No. 10-2014-0004796, filed Jan. 14, 2014, the entire contents of all of which are hereby incorporated by reference.

TECHNICAL FIELD

The present invention relates to a curing catalyst for epoxy resin compositions, an epoxy resin composition including the same, and an apparatus manufactured using the same.

BACKGROUND ART

Epoxy resins have low reaction shrinkage, excellent electrical, mechanical properties, and high processability and chemical resistance, and are used as a matrix and coating for electric, electronic, construction, and composite materials. For example, epoxy resins are used for encapsulation of semiconductor devices, adhesive films, insulating resin sheets such as prepregs, circuit boards, solder resists, underfills, die bonding agents, and component replenishing resins.

Generally, such an epoxy resin is used after being mixed with a curing agent to be a thermosetting material rather than being used alone. Here, since properties of the epoxy resin depend on a three-dimensional structure created after curing, selection of the curing agent is important. Although many curing agents for epoxy resins have been developed, a curing catalyst is used together in order to catalyze curing reaction. In an apparatus using an epoxy resin composition, there is a need for a curing agent having low temperature curability that allows the rein composition to be cured at low temperature for enhancement of productivity and high storage stability that catalyzes curing only at a desired temperature while not exhibiting catalytic activity at other temperatures for improvement of handling performance during distribution and storage. Since an adduct of triphenylphosphine and 1,4-benzoquinone, as a curing catalyst, catalyzes curing even at relatively low temperatures, there are problems in that, when an epoxy resin composition is mixed with other components before curing, the epoxy resin composition is partially cured by heat generated from the mixture system or externally applied heat, and in that after completion of mixing, the epoxy resin composition can undergo curing even during storage at room temperature and thus has poor storage stability. Such curing can cause the epoxy resin composition to exhibit increase in viscosity and deterioration in flowability when the epoxy resin composition is liquid, and can cause the epoxy resin composition to exhibit viscosity when the epoxy resin composition is solid, and such a state change is not uniform within the epoxy resin composition. As a result, when the epoxy resin composition is actually cured at high temperature, the epoxy resin composition can suffer from deterioration in moldability due to deterioration in flowability, and can cause deterioration in mechanical, electrical and chemical properties of a molded article. In the related art, Korean Patent No. 10-0290448 discloses an epoxy resin curing catalyst which is a carboxylate of a bicyclic amidine.

DISCLOSURE

Technical Problem

It is an aspect of the present invention to provide a curing catalyst for epoxy resin compositions, which can catalyze curing of an epoxy resin.

It is another aspect of the present invention to provide a curing catalyst for epoxy resin compositions, which can catalyze curing of an epoxy resin even at low temperature.

It is a further aspect of the present invention to provide a curing catalyst for epoxy resin compositions, which exhibits high storage stability to catalyze curing only at a desired curing temperature while not exhibiting any catalytic activity at other temperatures.

Technical Solution

In accordance with one aspect of the present invention, a curing catalyst for epoxy resin compositions is represented by Formula 1.

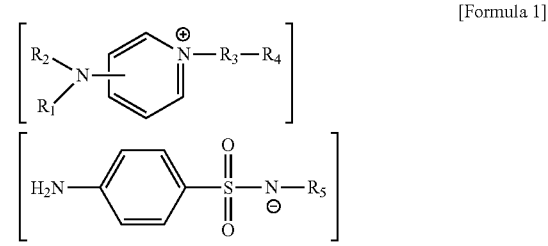

[Formula 1]

(where $R_1$, $R_2$, $R_3$, $R_4$ and $R_5$ are defined as in the detailed description).

In accordance with another aspect of the present invention, an epoxy resin composition may include an epoxy resin, a curing agent, and a curing catalyst, wherein the curing catalyst may include the curing catalyst for epoxy resin compositions as set forth above.

In accordance with a further aspect of the present invention, an apparatus may be manufactured using the epoxy resin composition as set forth above.

Advantageous Effects

The present invention provides a curing catalyst for epoxy resin compositions, which can catalyze curing of an epoxy resin and catalyze curing of an epoxy resin even at low temperature. In addition, the present invention provides a curing catalyst for epoxy resin compositions, which exhibits high storage stability to catalyze curing only at a desired curing temperature while not exhibiting any catalytic activity at other temperatures. Further, the present invention provides a curing catalyst for epoxy resin compositions, which minimizes change in viscosity of a mixture including an epoxy resin, a curing agent, and the like within predetermined ranges of time and temperature, thereby ensuring that an epoxy resin composition obtained after curing at high temperature does not exhibit any deterioration in moldability due to decrease in flowability, and a molded product manufactured using the epoxy resin composition does not suffer from deterioration in mechanical, electrical, and chemical properties.

BEST MODE

According to one embodiment of the present invention, there is provided a compound represented by Formula 1. For example, although the compound represented by Formula 1 can be used for other purposes, the compound represented by Formula 1 can be used as a curing catalyst for epoxy resin compositions.

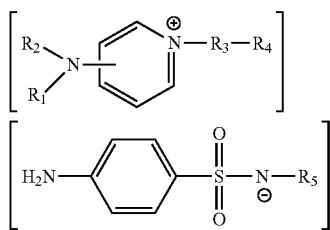

<Formula 1>

(where $R_1$ and $R_2$ are each independently hydrogen, a substituted or unsubstituted $C_1$ to $C_{10}$ alkyl group, a substituted or unsubstituted $C_6$ to $C_{20}$ aryl group, a substituted or unsubstituted $C_3$ to $C_{20}$ cycloalkyl group, a substituted or unsubstituted $C_2$ to $C_{20}$ heterocycloalkyl group, a substituted or unsubstituted $C_7$ to $C_{20}$ arylalkyl group, or a substituted or unsubstituted $C_3$ to $C_{20}$ heteroaryl group;

$R_3$ is a single bond, a substituted or unsubstituted $C_1$ to $C_{10}$ alkylene group, a substituted or unsubstituted $C_6$ to $C_{20}$ arylene group, a substituted or unsubstituted $C_3$ to $C_{20}$ cycloalkylene group, a substituted or unsubstituted $C_2$ to $C_{20}$ heterocycloalkylene group, or a substituted or unsubstituted $C_3$ to $C_{20}$ heteroarylene group;

$R_4$ is a substituted or unsubstituted $C_1$ to $C_{10}$ alkyl group, a substituted or unsubstituted $C_6$ to $C_{20}$ aryl group, a substituted or unsubstituted $C_3$ to $C_{20}$ cycloalkyl group, a substituted or unsubstituted $C_2$ to $C_{20}$ heterocycloalkyl group, a substituted or unsubstituted $C_7$ to $C_{20}$ arylalkyl group, or a substituted or unsubstituted $C_3$ to $C_{20}$ heteroaryl group; and $R_5$ is a substituted or unsubstituted $C_1$ to $C_{10}$ alkyl group, a substituted or unsubstituted $C_6$ to $C_{20}$ aryl group, a substituted or unsubstituted $C_3$ to $C_{20}$ cycloalkyl group, a substituted or unsubstituted $C_2$ to $C_{20}$ heterocycloalkyl group, a substituted or unsubstituted $C_7$ to $C_{20}$ arylalkyl group, a substituted or unsubstituted $C_3$ to $C_{20}$ heteroaryl group, or a compound represented by Formula 2.

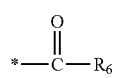

<Formula 2>

(where * is a binding site to N⁻ in Formula 1; and $R_6$ is a $C_1$ to $C_{10}$ alkyl group, a $C_6$ to $C_{20}$ aryl group, a $C_3$ to $C_{10}$ cycloalkyl group, or a $C_7$ to $C_{20}$ arylalkyl group)).

As used herein, the term "aryl group" refers to a substituent, in which all elements in the cyclic substituent have p-orbitals and the p-orbitals form a conjugated system, and the aryl group include mono- or fused functional groups (namely, rings of carbon atoms sharing adjacent electron pairs).

As used herein, the term "heteroaryl group" refers to an aryl group in which one to three atoms selected from the group consisting of nitrogen, oxygen, sulfur and phosphorus are included and the other atoms are carbon.

As used herein, the term "hetero" in the "heterocycloalkyl group", "heteroaryl group", "heterocycloalkylene group" and "heteroarylene group" refers to an atom which is nitrogen, oxygen, sulfur or phosphorus.

As used herein, the term "substituted" in "substituted or unsubstituted" means that at least one hydrogen atom in the corresponding functional groups is substituted with a $C_1$ to $C_{10}$ alkyl group, a $C_6$ to $C_{20}$ aryl group, a $C_3$ to $C_{20}$ cycloalkyl group, a $C_7$ to $C_{20}$ arylalkyl group, a $C_2$ to $C_{20}$ heterocycloalkyl group, a $C_4$ to $C_{20}$ heteroaryl group, a hydroxyl group, a cyano group, or an amine group.

Specifically, $R_1$ and $R_2$ may be each independently a $C_1$ to $C_5$ alkyl group, for example, a methyl, ethyl, propyl, butyl, or pentyl group. $R_3$ may be a $C_1$ to $C_5$ alkylene group, for example, a methylene, ethylene, propylene, butylene, or pentylene group. $R_4$ may be a single aromatic ring-containing or fused $C_6$ to $C_{18}$ aryl group, for example, a naphthyl, anthracenyl, phenanthrene, pyrenyl group, or the like. $R_5$ may be a substituted or unsubstituted $C_3$ to $C_{20}$ heteroaryl group, for example, a pyrazinyl group, a pyrimidinyl group, a diazinyl group such as a pyridazinyl group and the like, a pyridyl group, or an acetyl group.

Specifically, a moiety in Formula 1, which may be represented by Formula 14, may be bonded to a para-position with respect to nitrogen of pyridine, whereby the compound represented by Formula 1 can exhibit improvement in reactivity at low temperature, thereby improving a degree of cure of a resin composition.

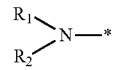

<Formula 14>

In one embodiment, the compound represented by Formula 1 may be a compound represented by Formula 3.

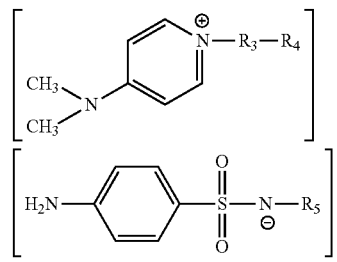

<Formula 3>

(where $R_3$, $R_4$ and $R_5$ are defined as in Formula 1).

The compound represented by Formula 1 may be added to an epoxy resin composition including an epoxy resin and a curing agent to be used as a latent curing catalyst. That is, when receiving external energy such as heat and the like, the compound represented by Formula 1 is decomposed at about 100° C. to about 150° C. to catalyze curing.

The compound represented by Formula 1 minimizes change in viscosity of the epoxy resin composition including the epoxy resin and the curing agent in predetermined ranges of time and temperature while catalyzing curing of the epoxy resin and the curing agent, thereby improving storage stability of the epoxy resin composition. As used herein, the term "storage stability" refers to the ability to catalyze curing only at a desired curing temperature while not exhibiting any catalytic activity at other temperatures. As a result, it is possible to store the epoxy resin composition for a long time without causing viscosity change. Generally, curing reaction can cause increase in viscosity and deterioration in flowability when the epoxy resin composition is liquid, and can exhibit viscosity when the epoxy resin composition is solid.

In addition, the compound represented by Formula 1 enables curing of the epoxy resin composition including the epoxy resin and the curing agent at low temperature, thereby allowing the epoxy resin composition to exhibit low-temperature curability. Specifically, when heated at a constant rate of about 10° C./min in a differential scanning calorimeter (DSC) (TA 100, TA instruments), the epoxy resin composition including the compound represented by Formula 1 may have a $T_0$ (a start or initiation temperature of exothermic polymerization) of about 80° C. to less than about 110° C., for example, about 80° C. to about 105° C., and a $T_{max}$ (a maximum temperature of an exothermic peak corresponding to maximum acceleration of reaction, a maximum reaction temperature) of about 100° C. to less than about 140° C., for example, about 100° C. to about 135° C., thereby enabling curing and completion of reaction at low temperature while exhibiting a high degree of cure.

The compound represented by Formula 1 is a salt containing a pyridine-containing cation and an anion, and can exhibit good storability, handling performance, and the like.

The compound represented by Formula 1 may be present in an amount of about 0.01% by weight (wt %) to about 5 wt %, for example, about 0.02 wt % to about 1.5 wt %, for example, about 0.05 wt % to about 1.5 wt % in the epoxy resin composition in terms of solid content. Within this range, the compound does not delay curing time and can secure flowability of the composition.

The compound represented by Formula 1 may be prepared by a typical method. For example, referring to Reaction Formula 1 described below, the compound represented by Formula 1 may be prepared by primarily reacting a compound represented by Formula 4 with a compound represented by Formula 5 to produce a compound represented by Formula 6, followed by secondly reacting the compound represented by Formula 6 with a compound represented by Formula 7.

<Reaction Formula 1>

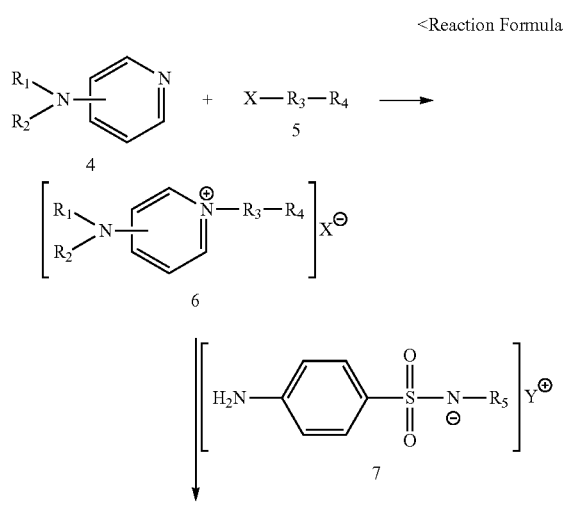

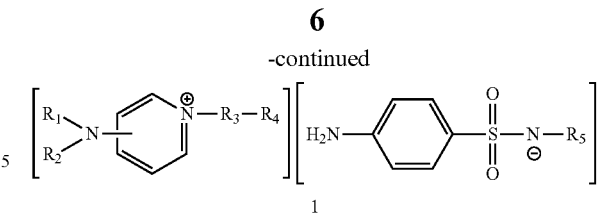

(where $R_1$, $R_2$, $R_3$, $R_4$ and $R_5$ are defined as in Formula 1, X is a halogen, and Y is an alkali metal).

The halogen may be fluorine, chlorine, bromine or iodine, and the alkali metal may be lithium, sodium, potassium, rubidium, cesium or francium.

Primary reaction may be performed at about 10° C. to about 80° C., for example, at about 40° C. to about 70° C. for about 1 hour to about 30 hours, for example, for about 10 hours to about 30 hours in an organic solvent, such as toluene, methylene chloride, acetonitrile, and N,N-dimethylformamide. Secondary reaction may be performed at about 10° C. to about 80° C., for example, at about 40° C. to about 70° C. for about 1 hour to about 30 hours, for example, for about 10 hours to about 30 hours in at least one solvent of toluene, methylene chloride, acetonitrile, N,N-dimethylformamide, and water.

Hereinafter, an epoxy resin composition according to one embodiment of the present invention will be described in detail.

The epoxy resin composition may include an epoxy resin, a curing agent and a curing catalyst, wherein the curing catalyst may include the compound represented by Formula 1.

The epoxy resin may include bisphenol A, bisphenol F, phenol novolac, tert-butylcatechol, naphthalene, glycidyl amine, cresol novolac, biphenyl, linear aliphatic, alicyclic, heterocyclic, spiro ring-containing, cyclohexanedimethanol, halogenated epoxy resins, and the like. These epoxy resins may be used alone or in combination thereof. For example, the epoxy resin may be an epoxy resin in which at least two epoxy groups and at least one hydroxyl group are included in a molecule. The epoxy resin may include at least one of solid and liquid epoxy resins. For example, the epoxy resin may be a solid epoxy resin.

In one embodiment, the epoxy resin may be a biphenyl epoxy resin represented by Formula 8.

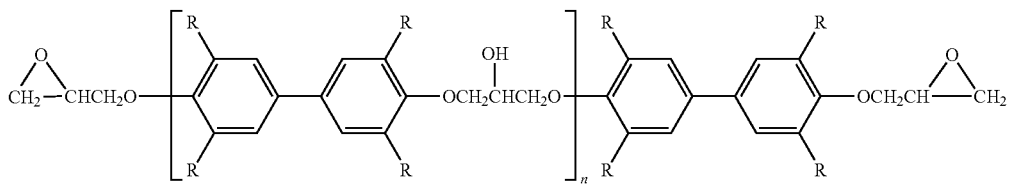

<Formula 8>

(where R is a $C_1$ to $C_4$ alkyl group, and an average value of n ranges from 0 to 7).

The epoxy resin may be present in an amount of about 1 wt % to about 90 wt %, for example, about 2 wt % to about 17 wt %, for example, about 3 wt % to about 15 wt %, for example, about 3 wt % to about 12 wt % in the composition in terms of solid content. Within this range, the resin composition does not suffer from deterioration in curability.

The curing agent may include phenol aralkyl phenol resins, phenol novolac phenol resins, xyloc phenol resins, cresol novolac phenol resins, naphthol phenol resins, terpene phenol resins, polyfunctional phenol resins, dicyclopentadiene phenol resins, novolac phenol resins synthesized from bisphenol A and resol, tris(hydroxyphenyl)methane, polyvalent phenol compounds including dihydroxybiphenyl, acid anhydrides including maleic anhydride and phthalic anhydride, aromatic amines such as m-phenylenediamine, diaminodiphenylmethane, diaminodiphenylsulfone, and the like. For example, the curing agent may be a xyloc phenol resin represented by Formula 9.

The non-pyridine curing catalyst may include tertiary amines, organometallic compounds, organophosphorus compounds, imidazoles, boron compounds, and the like. The tertiary amines may include benzyldimethylamine, triethanolamine, triethylenediamine, diethylaminoethanol, tri(dimethylaminomethyl)phenol, 2-2-(dimethylaminomethyl)phenol, 2,4,6-tris(diaminomethyl)phenol, tri-2-ethylhexanoate, and the like. Examples of organometallic compounds may include chromium acetylacetonate, zinc acetylacetonate, nickel acetylacetonate, and the like. Examples of organophosphorus compounds may include tris-4-methoxyphosphine, triphenylphosphine, triphenylphosphine triphenylborane, triphenylphosphine-1,4-benzoquinone adducts, and the like. Examples of imidazoles may include 2-methylimidazole, 2-phenylimidazole, 2-aminoimidazole, 2-methyl-1-vinylimidazole, 2-ethyl-4-methylimidazole, 2-heptadecylimidazole, and the like. Examples of boron compounds may include triphenylphosphine tetraphenylborate, tetraphenyl borate, trifluoroborane-n-hexylamine, trifluoroborane monoethylamine, tetrafluoroborane triethylamine, tetrafluo-

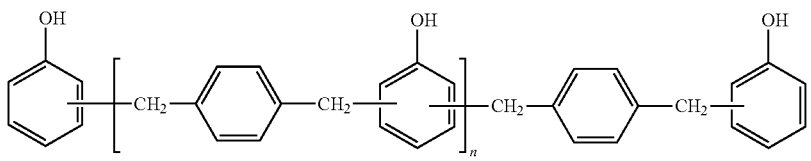

<Formula 9>

(where an average value of n ranges from 0 to 7).

The curing agent may be present in an amount of about 0.1 wt % to about 90 wt %, for example, about 0.5 wt % to about 13 wt %, for example, about 1 wt % to about 10 wt %, for example, about 2 wt % to about 8 wt % in the epoxy resin composition in terms of solid content. Within this range, the resin composition does not suffer from deterioration in curability.

The curing catalyst may include the compound represented by Formula 1. The epoxy resin composition includes the compound represented by Formula 1 as the curing catalyst, whereby curing of the epoxy resin can be catalyzed even at low temperature, the epoxy resin composition can exhibit high low-temperature curability and storage stability, and change in viscosity of the epoxy resin composition including the epoxy resin and the curing agent can be minimized even in predetermined ranges of time and temperature.

The compound represented by Formula 1 may be present in an amount of about 10 wt % to about 100 wt %, for example, about 60 wt % to about 100 wt % in the total curing catalyst. Within this range, curing time is not delayed, and flowability of the composition can be secured.

The curing catalyst may further include a non-pyridine curing catalyst which does not include a pyridine moiety.

roboraneamine, and the like. In addition, the curing catalyst may include 1,5-diazabicyclo[4.3.0]non-5-ene (DBN), 1,8-diazabicyclo[5.4.0]undec-7-ene (DBU), phenol novolac resin salts, and the like. For example, as the curing catalyst, organophosphorus, boron, amine and imidazole curing catalysts may be used alone or in combination thereof. The curing catalyst may also be used in the form of adducts obtained by pre-reacting the curing catalyst with an epoxy resin or a curing agent.

The curing catalyst may be present in an amount of about 0.01 wt % to about 10 wt %, for example, about 0.01 wt % to about 5 wt %, for example, about 0.02 wt % to about 1.5 wt %, for example, about 0.05 wt % to about 2.0 wt % in the epoxy resin composition. Within this range, the curing catalyst does not delay curing time and can secure flowability of the composition.

The epoxy resin composition can be cured even at low temperature and may have a curing initiation temperature of about 80° C. to less than about 110° C., for example, about 80° C. to about 105° C. Within this range, sufficient curing of the epoxy resin composition can be carried out even at low temperature, thereby achieving curing at low temperature.

Due to high storage stability of the epoxy resin composition, the epoxy resin composition is not cured even when stored at a temperature in a predetermined range for a predetermined period of time, thereby exhibiting low viscosity change. According to one embodiment, the epoxy resin composition may have a rate of viscosity change of about 5% or less, for example, about 3% to about 5%, as calculated by Equation 1.

$$\text{Rate of viscosity change} = |B-A|/A \times 100 \quad \text{[Equation 1]}$$

(where A is the viscosity (unit: cPs) of the epoxy resin composition as measured at about 25° C. and B is the viscosity (unit: cPs) of the epoxy resin composition as measured at about 25° C. after leaving the epoxy resin composition at about 25° C. for about 24 hours). Within this range, since the epoxy resin composition exhibits high storage stability, curing of the epoxy resin composition is catalyzed only at a desired curing temperature, and catalytic activity is not exhibited at other curing temperatures. In addition, the epoxy resin composition does not suffer deterioration in moldability due to poor flowability when undergoing curing reaction at high temperature, thereby preventing degradation in mechanical, electrical, and chemical properties of a molded product manufactured using the resin composition.

The epoxy resin composition may have a curing shrinkage of less than about 0.4%, for example, about 0.01% to about 0.39%, as calculated by Equation 2.

$$\text{Curing shrinkage} = |C-D|/C \times 100 \quad \text{[Equation 2]}$$

(where C is the length of a specimen obtained by transfer molding of the epoxy resin composition at 175° C. under a load of 70 kgf/cm$^2$, and D is the length of the specimen after post-curing the specimen at 170° C. to 180° C. for 4 hours and cooling). Within this range, curing shrinkage is low and the epoxy resin composition can be used for desired applications.

The epoxy resin composition may further include a typical additive. In one embodiment, the additive may include at least one of a coupling agent, a release agent, a stress reliever, a crosslinking enhancer, a leveling agent, and a coloring agent.

The coupling agent may include at least one selected from the group consisting of epoxysilanes, aminosilanes, mercaptosilanes, alkylsilanes, and alkoxysilanes, without being limited thereto. The coupling agent may be present in an amount of about 0.1 wt % to about 3 wt % in the epoxy resin composition.

The release agent may include at least one selected from the group consisting of paraffin wax, ester wax, higher fatty acids, metal salts of higher fatty acids, natural fatty acids, and natural fatty acid metal salts. The release agent may be present in an amount of about 0.1 wt % to about 3 wt % in the epoxy resin composition.

The stress reliever may include at least one selected from the group consisting of modified silicone oil, silicone elastomers, silicone powder, and silicone resin, without being limited thereto. The stress reliever may be optionally present in an amount of about 6.5 wt % or less, for example, about 1 wt % or less, for example, about 0.1 wt % to about 1 wt % in the epoxy resin composition. As the modified silicone oil, any silicone polymers having good heat resistance may be used. The modified silicone oil may include about 0.05 wt % to about 1.5 wt % of a silicone oil mixture in the epoxy resin composition, wherein the mixture includes at least one selected from the group consisting of silicone oil having an epoxy functional group, silicone oil having an amine functional group, silicone oil having a carboxyl functional group, and a combination thereof. However, if the amount of the silicone oil is greater than about 1.5 wt %, surface contamination occurs easily and lengthy resin bleed can be encountered. If the amount of the silicone oil is less than 0.05 wt %, there can be a problem in that sufficiently low modulus of elasticity cannot be obtained. In addition, the silicone powder having an average particle diameter of about 15 μm or less is particularly preferred in that the powder does not deteriorate moldability. The silicone powder may be optionally present in an amount of about 5 wt % or less, for example, about 0.1 wt % to about 5 wt %, based on the total weight of the epoxy resin composition.

The coloring agent may be carbon black or the like, and may be present in an amount of about 0.1 wt % to about 3 wt % in the epoxy resin composition.

The additive may be present in an amount of about 0.1 wt % to about 10 wt %, for example, about 0.1 wt % to about 3 wt % in the epoxy resin composition.

Hereinafter, an epoxy resin composition according to another embodiment of the present invention will be described in detail.

The epoxy resin composition according to another embodiment of the invention may include an epoxy resin, a curing agent, a curing catalyst and inorganic fillers, wherein the curing catalyst may include the compound represented by Formula 1. The epoxy resin composition according to this embodiment is substantially the same as the epoxy resin composition according to the above embodiment except that the epoxy resin composition according to this embodiment further includes inorganic fillers. Therefore, the inorganic fillers will be described in detail hereinafter.

The inorganic fillers are used to improve mechanical properties of the epoxy resin composition while reducing stress in the epoxy resin composition. Examples of the inorganic fillers include at least one of fused silica, crystalline silica, calcium carbonate, magnesium carbonate, alumina, magnesia, clay, talc, calcium silicate, titanium oxide, antimony oxide, and glass fibers.

For example, fused silica having a low coefficient of linear expansion is preferred in terms of stress reduction. The fused silica refers to amorphous silica having a specific gravity of 2.3 or less. The fused silica may be prepared by melting crystalline silica or may include amorphous silica products synthesized from various raw materials. Although the shape and particle diameter of the fused silica are not particularly limited, the inorganic fillers may include about 40 wt % to about 100 wt % of a fused silica mixture based on the total weight of the inorganic fillers, wherein the fused silica mixture includes about 50 wt % to about 99 wt % of spherical fused silica having an average particle diameter of about 5 μm to about 30 μm and about 1 wt % to about 50 wt % of spherical fused silica having an average particle diameter of about 0.001 μm to about 1 μm. The inorganic fillers may also be adjusted to a maximum particle diameter of about 45 μm, about 55 μm or about 75 μm, depending upon application of the epoxy resin composition. Although the spherical fused silica may include conductive carbon as a foreign substance on the surface of silica, it is essential for the spherical fused silica to incorporate a smaller amount of polar foreign substances.

The inorganic fillers may be present in an appropriate amount depending upon desired physical properties of the epoxy resin composition, for example, moldability, low-stress properties, and high-temperature strength. In one embodiment, the inorganic filler may be present in an amount of about 70 wt % to about 95 wt %, for example, about 75 wt % to about 92 wt % in the epoxy resin composition. Within this range, the epoxy resin composition can secure good flame resistance, flowability, and reliability.

The epoxy resin composition according to the present invention can be used in a broad range of applications requiring such an epoxy resin composition in encapsulation of semiconductor devices, adhesive films, insulating resin sheets such as prepregs and the like, circuit substrates, solder resists, underfills, die bonding materials, and component replenishing resins, without being limited thereto.

(1) Encapsulation of Semiconductor Devices

The epoxy resin composition according to the present invention may be used to encapsulate a semiconductor device, and include an epoxy resin, a curing agent, a phosphonium compound-containing curing catalyst, inorganic fillers, and additives.

According to one embodiment, the epoxy resin may be present in an amount of about 2 wt % to about 17 wt %, for example, about 3 wt % to about 12 wt %. Within this range, the epoxy resin composition can exhibit excellent flowability, flame retardancy and reliability. In addition, the curing catalyst including the compound represented Formula 1 may be present in an amount of about 0.01 wt % to about 5 wt %, for example, about 0.05 wt % to about 1.5 wt %. Within this range, since the amount of unreacted epoxy groups and phenolic hydroxyl groups can be reduced, the epoxy resin composition can exhibit excellent reliability. The curing agent may be present in an amount of about 0.5 wt % to about 13 wt %, for example, about 2 wt % to about 8 wt % in the composition. Within this range, since the amount of unreacted epoxy groups and phenolic hydroxyl groups can be reduced, the epoxy resin composition can exhibit excellent reliability. The inorganic fillers may be present in an amount of about 70 wt % to about 95 wt %, for example, about 75 wt % to about 92 wt %. Within this range, the epoxy resin composition can exhibit excellent flowability, flame retardancy, and reliability. The additives may be present in an amount of about 0.1 wt % to about 10 wt %, for example, about 0.1 wt % to about 3 wt %.

The epoxy resin in the epoxy resin composition may be used alone or in the form of adducts, such as a melt master batch, obtained by pre-reaction of the epoxy resin with additives such as a curing agent, a curing catalyst, a release agent, a coupling agent, and a stress reliever. Although the method of preparing the epoxy resin composition is not particularly limited, the epoxy resin composition may be prepared by a process in which components of the composition are mixed uniformly and sufficiently using a Henschel mixer or a Lödige mixer, followed by melt kneading using a roll mill or a kneader at about 90° C. to about 120° C., and then cooling and pulverizing.

As a method for encapsulating a semiconductor device using the epoxy resin composition obtained according to the present invention, low-pressure transfer molding may be generally used. However, it should be understood that injection molding or casting may also be employed for molding of the epoxy resin composition. The semiconductor device that can be fabricated by such a molding process may include a copper lead frame, an iron lead frame, an iron lead frame pre-plated with at least one metal selected from among nickel, copper and palladium, or an organic laminate frame.

(2) Adhesive Film

The epoxy resin composition may be used as an adhesive film for a printed wiring board by applying the epoxy resin composition to a support film, followed by curing. An adhesive film may be prepared by a typical method known in the art, for example, a process wherein the epoxy resin composition is dissolved in an organic solvent, and the dissolved composition is coated onto a support film, followed by drying the organic solvent through heating or hot air blasting. As the organic solvent, ketones such as acetone or methylethylketone; acetic acid esters such as ethyl acetate or butyl acetate; carbitols such as cellosolve or butyl carbitol; aromatic hydrocarbons such as toluene; and amide solvents such as dimethylformamide may be used. These may be used alone or in combination thereof. Although drying conditions are not particularly limited, the organic solvent may be dried at about 50° C. to about 100° C. for about 1 to 10 minutes such that the organic solvent can be present in an amount of about 10 wt % or less in the coating layer. As the support film, polyolefins such as polyethylene or polypropylene, polyesters such as polyethylene terephthalate, polycarbonate, polyimide, and the like may be used. The support film may have a thickness of about 10 μm to about 150 μm.

(3) Prepreg

The epoxy resin composition may be used as a prepreg by impregnating a sheet-like reinforcement substrate with the epoxy resin composition, followed by semi-curing through heating. The reinforcement substrate may include any suitable fibers generally used for prepregs, such as glass cloths or aramid fibers, without limitation.

A further aspect of the invention relates to an apparatus manufactured using the epoxy resin composition as set forth above. For example, the apparatus may include a semiconductor device encapsulated with the epoxy resin composition, a multilayer wiring board including an adhesive film formed of the epoxy resin composition, and the like.

MODE FOR INVENTION

Hereinafter, the present invention will be described in more detail with reference to some examples. It should be understood that these examples are provided for illustration only and are not to be construed in any way as limiting the present invention.

Example 1

1.2 g of 4-(dimethylamino)pyridine and 1.9 g of 2-(chloromethyl)naphthalene were dissolved in 30 ml of toluene, followed by reacting at 60° C. for 5 hours and then filtering and drying a produced precipitate, thereby obtaining 2.2 g of a solid. 2.2 g of the obtained solid and 2.5 g of sodium sulfadiazine were dissolved in 50 ml of a methylene chloride/H$_2$O 1:1 solution, followed by reacting at room temperature for 24 hours. Next, the methylene chloride layer was subjected to distillation under reduced pressure (evaporating), thereby obtaining 3.0 g of a solid represented by Formula 10.

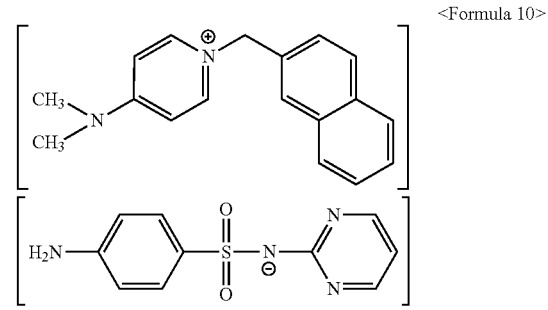

<Formula 10>

¹H NMR (400 MHz, DMSO) 8.42 (d, J=2.2 Hz, 2H), 7.78 (dd, J=7.2, 2.4 Hz, 2H), 7.70-7.10 (m, 7H), 7.58 (d, J=9.0 Hz, 2H), 6.64 (d, J=2.2 Hz, 2H), 6.60 (t, J=4.8 Hz, 1H), 6.49 (d, J=9.0 Hz, 2H), 5.65 (br, 2H), 5.53 (s, 2H), 2.45 (s, 6H) ppm; LC-MS m/z=512 (M⁺); Anal. Calcd for $C_{28}H_{28}N_6O_2S$: C, 65.60; H, 5.51; N, 16.39. Found: C, 65.49; H, 5.69; N, 16.41.

Example 2

1.2 g of 4-(dimethylamino)pyridine and 1.9 g of 2-(chloromethyl)naphthalene were dissolved in 30 ml of toluene, followed by reacting at 60° C. for 5 hours and then filtering and drying a produced precipitate, thereby obtaining 2.2 g of a solid. 2.2 g of the obtained solid and 2.6 g of sodium sulfamerazine were dissolved in 50 ml of a methylene chloride/H₂O 1:1 solution, followed by reacting at room temperature for 24 hours. Next, the methylene chloride layer was subjected to distillation under reduced pressure (evaporating), thereby obtaining 3.0 g of a solid represented by Formula 11.

<Formula 11>

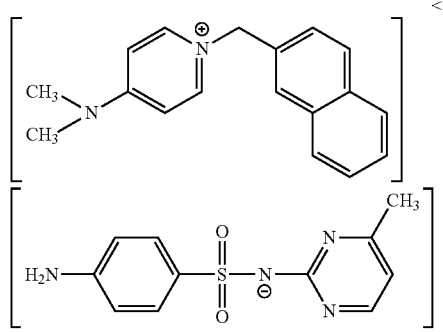

¹H NMR (400 MHz, DMSO) 8.42 (d, J=2.2 Hz, 2H), 7.78 (dd, J=7.5 Hz, 1H), 7.70-7.10 (m, 7H), 7.56 (d, J=8.4 Hz, 2H), 6.64 (d, J=2.2 Hz, 2H), 6.53 (m, 1H), 6.51 (d, J=8.4 Hz, 2H), 5.60 (br, 2H), 5.53 (s, 2H), 2.45 (s, 6H), 2.19 (s, 3H) ppm; LC-MS m/z=526 (M⁺); Anal. Calcd for $C_{29}H_{30}N_6O_2S$: C, 66.14; H, 5.74; N, 15.96. Found: C, 66.32; H, 5.64; N, 16.09.

Example 3

1.2 g of 4-(dimethylamino)pyridine and 1.9 g of 2-(chloromethyl)naphthalene were dissolved in 30 ml of toluene, followed by reacting at 60° C. for 5 hours. Next, a precipitate was filtered, followed by drying, thereby obtaining 2.2 g of a solid. 2.2 g of the obtained solid and 2.7 g of sodium sulfamethazine were dissolved in 50 ml of a methylene chloride/H₂O 1:1 solution, followed by reacting at room temperature for 24 hours. Next, the methylene chloride layer was subjected to distillation under reduced pressure (evaporating), thereby obtaining 3.0 g of a solid represented by Formula 12.

<Formula 12>

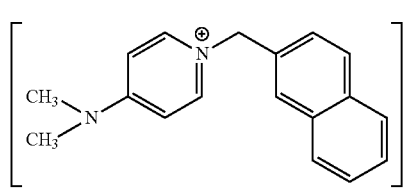

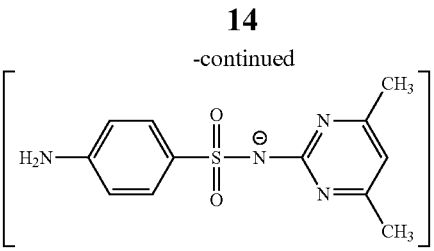

¹H NMR (400 MHz, DMSO) 8.42 (d, J=2.2 Hz, 2H), 7.70-7.10 (m, 7H), 7.58 (d, J=8.8 Hz, 2H), 6.64 (d, J=2.2 Hz, 2H), 6.51 (m, 1H), 6.49 (d, J=8.8 Hz, 2H), 5.69 (br, 2H), 5.53 (s, 2H), 2.45 (s, 6H), 2.15 (s, 6H) ppm; LC-MS m/z=512 (M⁺); Anal. Calcd for $C_{30}H_{32}N_6O_2S$: C, 66.64; H, 5.97; N, 15.54. Found: C, 66.43; H, 5.74; N, 15.49.

Example 4

1.2 g of 4-(dimethylamino)pyridine and 1.9 g of 2-(chloromethyl)naphthalene were dissolved in 30 ml of toluene, followed by reacting at 60° C. for 5 hours. Next, a precipitate was filtered, followed by drying, thereby obtaining 2.2 g of a solid. 2.2 g of the obtained solid and 2.5 g of sodium sulfacetamide were dissolved in 50 ml of a methylene chloride/H₂O 1:1 solution, followed by reacting at room temperature for 24 hours. Next, the methylene chloride layer was subjected to distillation under reduced pressure (evaporating), thereby obtaining 3.0 g of a solid represented by Formula 13.

<Formula 13>

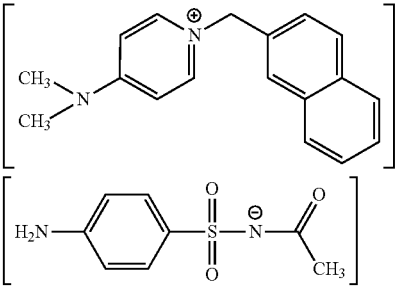

¹H NMR (400 MHz, DMSO) 8.44 (d, J=2.2 Hz, 2H), 7.69-7.10 (m, 7H), 7.43 (d, J=8.8 Hz, 2H), 6.64 (d, J=2.2 Hz, 2H), 6.47 (d, J=8.8 Hz, 2H), 5.61 (br, 2H), 5.53 (s, 2H), 2.45 (s, 6H), 1.66 (s, 3H) ppm; LC-MS m/z=476 (M⁺); Anal. Calcd for $C_{26}H_{28}N_4O_3S$: C, 65.52; H, 5.92; N, 11.76. Found: C, 65.78; H, 5.64; N, 11.59.

Example 5

7.5 parts by weight of a biphenyl epoxy resin (NC-3000, Nippon Kayaku Co., Ltd.), 4.3 parts by weight of a xyloc type phenol resin (HE100C-10, Air Water Co., Ltd.), 0.2 parts by weight of the compound of Example 1, 87 parts by weight of inorganic fillers obtained by mixing spherical fused silica having an average particle diameter of 18 μm with spherical fused silica having an average particle diameter of 0.5 μm in a weight ratio of 9:1, 0.4 parts by weight of a coupling agent obtained by mixing 0.2 parts by weight of mercaptopropyltrimethoxysilane (KBM-803, Shin Etsu Co., Ltd.) with 0.2 parts by weight of methyltrimethoxysilane (SZ-6070, Dow Corning Chemical Co., Ltd.), 0.3 parts by weight of carnauba wax as a release agent, and 0.3 parts by weight of carbon black (MA-600. Matsushita Chemical Co., Ltd.) as a coloring agent were mixed, followed by uniformly stirring using a Henschel mixer, thereby obtaining a powdery composition. Then, the obtained powder was subjected to melt kneading using a continuous kneader at 95° C., followed by cooling and pulverizing, thereby preparing an epoxy resin composition for encapsulation of a semiconductor device.

Example 6

An epoxy resin composition was prepared in the same manner as in Example 5 except that the compound in Example 2 was used instead of the compound in Example 1.

Example 7

An epoxy resin composition was prepared in the same manner as in Example 5 except that the compound in Example 3 was used instead of the compound in Example 1.

Example 8

An epoxy resin composition was prepared in the same manner as in Example 5 except that the compound in Example 4 was used instead of the compound in Example 1.

Comparative Example 1

An epoxy resin composition was prepared in the same manner as in Example 5 except that the compound in Example 1 was not used.

Comparative Example 2

An epoxy resin composition was prepared in the same manner as in Example 5 except that triphenylphosphine was used instead of the compound in Example 1.

Comparative Example 3

An epoxy resin composition was prepared in the same manner as in Example 5 except that a triphenylphosphine-1,4-benzoquinone adduct was used instead of the compound in Example 1.

The epoxy resin compositions prepared in Examples and Comparative Examples were evaluated as to properties as listed in Table 1.

TABLE 1

|  |  |  | Example | | | | Comparative Example | | |
|---|---|---|---|---|---|---|---|---|---|
|  |  |  | 5 | 6 | 7 | 8 | 1 | 2 | 3 |
| Basic physical properties | Flowability (inch) | | 71 | 74 | 72 | 72 | 89 | 51 | 59 |
|  | Curing shrinkage (%) | | 0.34 | 0.33 | 0.35 | 0.35 | 0.25 | 0.42 | 0.41 |
|  | Glass transition temperature (° C.) | | 124 | 124 | 123 | 123 | 138 | 121 | 122 |
|  | Moisture absorption rate (%) | | 0.24 | 0.25 | 0.24 | 0.24 | 0.24 | 0.25 | 0.25 |
|  | Adhesive strength (kgf) | | 73 | 74 | 75 | 75 | 21 | 72 | 73 |
|  | DSC | $T_0$ (° C.) | 95 | 98 | 99 | 95 | 158 | 118 | 110 |
|  |  | Tmax (° C.) | 130 | 133 | 134 | 129 | 185 | 145 | 140 |
|  |  | ΔH (unit: J/g) | 105 | 111 | 108 | 115 | 12 | 110 | 108 |
| Evaluation of packages | Degree of cure (Shore D) according to curing time | 50 sec | 69 | 70 | 71 | 72 | 23 | 52 | 60 |
|  |  | 60 sec | 71 | 72 | 73 | 74 | 25 | 60 | 64 |
|  |  | 70 sec | 72 | 73 | 74 | 76 | 25 | 64 | 66 |
|  |  | 80 sec | 73 | 75 | 74 | 76 | 26 | 67 | 70 |
|  |  | 90 sec | 73 | 75 | 74 | 76 | 28 | 67 | 71 |
|  | Storage stability Reliability | 24 hr | 97% | 97% | 97% | 97% | 98% | 90% | 92% |
|  |  | 48 hr | 95% | 94% | 95% | 94% | 98% | 78% | 83% |
|  |  | 72 hr | 91% | 93% | 92% | 92% | 98% | 69% | 75% |
|  |  | Number of packages suffering cracking | 0 | 0 | 0 | 0 | — | 0 | 0 |
|  |  | Number of packages suffering peeling | 0 | 0 | 0 | 0 | — | 44 | 20 |
|  |  | Number of tested semiconductors | 88 | 88 | 88 | 88 | — | 88 | 88 |

As shown in Table 1, the epoxy resin composition according to the present invention exhibited high flowability and low curing shrinkage, and exhibited a higher degree of cure even after short curing time when the degrees of cure according to curing time were compared. In addition, in terms of storage stability, the epoxy resin composition according to the present invention exhibited a small difference in flowability even after 72 hours. Further, the epoxy resin composition according to the present invention did not suffer external cracking and thus had excellent crack resistance, and did not suffer from peeling and thus exhibited excellent moisture resistance.

On the contrary, the epoxy resin composition of Comparative Example 1, which did not include the compound represented by Formula 1, was not cured and thus did not exhibit cure strength. In addition, the epoxy resin compositions of Comparative Examples 2 and 3, which included an existing curing catalyst instead of the compound represented by Formula 1, exhibited lower flowability and higher curing shrinkage than the epoxy resin composition according to the present invention, and exhibited a low degree of cure after short curing time.

(1) Flowability: The flow length of each of the epoxy resin compositions was measured using a transfer molding press in a testing mold at 175° C. and 70 kgf/cm² in accordance with EMMI-1-66. A higher measured value indicates better flowability.

(2) Curing shrinkage: Each of the epoxy resin compositions was molded using a transfer molding press in an ASTM mold for flexural strength specimen construction at 175° C. and 70 kgf/cm² to obtain a molded specimen (125 mm×12.6 mm×6.4 mm). The specimen was subjected to post-molding curing (PMC) in an oven at 170° C. to 180° C. for 4 hours. After cooling, the length of the specimen was measured using calipers. Curing shrinkage of the epoxy resin composition was calculated by Equation 2.

Curing shrinkage={(Length of mold at 175° C.−Length of specimen)÷(Length of mold at 175° C.)}×100  [Equation 2]

(3) Glass transition temperature: Glass transition temperature was measured using a thermomechanical analyzer (TMA). TMA was set to measure glass transition temperature by heating at a rate of 10° C./min from 25° C. to 300° C.

(4) Moisture absorption rate: Each of the resin compositions prepared in Examples and Comparative Examples was molded at a mold temperature of 170° C. to 180° C., a clamp pressure of 70 kg/cm², a transfer pressure of 1,000 psi and a transfer speed of 0.5 to 1 cm/s for a curing time of 120 sec to obtain a cured specimen in the form of a disc having a diameter of 50 mm and a thickness of 1.0 mm. The specimen was subjected to post-molding curing (PMC) in an oven at 170° C. to 180° C. for 4 hours and left at 85° C. and 85% RH for 168 hours, followed by measuring a weight change of the specimen due to moisture absorption, thereby calculating a moisture absorption rate according to Equation 3.

Moisture absorption rate=(Weight of specimen after moisture absorption−Weight of specimen before moisture absorption)÷(Weight of specimen before moisture absorption)×100  [Equation 3]

(5) Adhesive strength (kgf): A copper metal device having a size adapted to a mold for adhesive strength measurement was prepared as a test piece. Each of the resin compositions prepared in Examples and Comparative Examples was molded on the test piece at a mold temperature of 170° C. to 180° C., a clamp pressure of 70 kgf/cm², a transfer pressure of 1,000 psi and a transfer speed of 0.5 to 1 cm/s for a curing time of 120 sec to obtain a cured specimen. The specimen was subjected to post-molding curing (PMC) in an oven at 170° C. to 180° C. for 4 hours. The area of the epoxy resin composition in contact with the specimen was 40±1 mm², and the adhesive strength of the epoxy resin composition was measured with respect to 12 specimens in each measurement process using a universal testing machine (UTM) and the measured adhesive strength values were averaged.

(6) DSC measurement: Measurement was performed by heating 3 mg to 10 mg of the composition at a constant heating rate of 10° C./min in a DSC (TA 100, TA Instruments Inc. Measured parameters were $T_0$ (a start or initiation temperature of exothermic polymerization), $T_{max}$ (a maximum temperature of an exothermic peak corresponding to maximum acceleration of reaction), and $\Delta H$ (an integral value obtained by integration of a DSC curve corresponding to the total amount of heat generated in polymerization).

(7) Degree of cure (shore-D): Each of the epoxy resin compositions was cured using a multi plunger system (MPS) equipped with a mold at 175° C. for 50 sec, 60 sec, 70 sec, 80 sec, and 90 sec to construct exposed thin quad flat packages (eTQFPs), each including a copper metal device having a width of 24 mm, a length of 24 mm and a thickness of 1 mm. Hardness of the cured products in the packages on the mold according to the curing periods of time were directly measured using a Shore D durometer. A higher hardness value indicates better degree of cure.

(8) Storage stability: The flow length of each of the epoxy resin compositions was measured in accordance with the method described in (1) while storing the compositions for one week in a thermo-hygrostat set to at 25° C./50% RH at an interval of 24 hours. Percent (%) of the flow length after storage to the flow length immediately after preparation of the composition was calculated. A higher value indicates better storage stability.

(9) Reliability: Each of eTQFP packages for evaluation of flexural properties was dried at 125° C. for 24 hours, followed by 5 cycles of thermal shock testing (1 cycle refers to a series of leaving the package alone at −65° C. for 10 min, at 25° C. for 10 min, and at 150° C. for 10 min). Then, the package was left at 85° C. and 60% RH for 168 hours and treated by IR reflow three times at 260° C. for 30 sec (preconditioning), followed by observing occurrence of external cracks on the package using an optical microscope. Next, the occurrence of peeling between the epoxy resin composition and a lead frame was evaluated using C-mode scanning acoustic microscopy (C-SAM) which is a non-destructive test method. External cracks of the package or peeling between the epoxy resin composition and the lead frame mean that reliability of the package cannot be guaranteed.

It should be understood that various modifications, changes, alterations, and equivalent embodiments can be made by those skilled in the art without departing from the spirit and scope of the invention.

The invention claimed is:

1. A curing catalyst for epoxy resin compositions, the curing catalyst being represented by Formula 1,

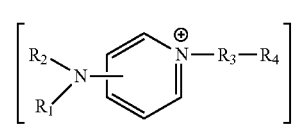

<Formula 1>

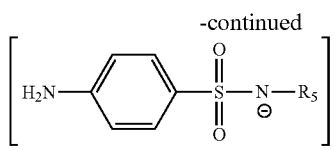

wherein, in Formula 1, $R_1$ and $R_2$ are each independently hydrogen, a substituted or unsubstituted $C_1$ to $C_{10}$ alkyl group, a substituted or unsubstituted $C_6$ to $C_{20}$ aryl group, a substituted or unsubstituted $C_3$ to $C_{20}$ cycloalkyl group, a substituted or unsubstituted $C_2$ to $C_{20}$ heterocycloalkyl group, a substituted or unsubstituted $C_7$ to $C_{20}$ arylalkyl group, or a substituted or unsubstituted $C_3$ to $C_{20}$ heteroaryl group;

$R_3$ is a single bond, a substituted or unsubstituted $C_1$ to $C_{10}$ alkylene group, a substituted or unsubstituted $C_6$ to $C_{20}$ arylene group, a substituted or unsubstituted $C_3$ to $C_{20}$ cycloalkylene group, a substituted or unsubstituted $C_2$ to $C_{20}$ heterocycloalkylene group, or a substituted or unsubstituted $C_3$ to $C_{20}$ heteroarylene group;

$R_4$ is a substituted or unsubstituted $C_1$ to $C_{10}$ alkyl group, a substituted or unsubstituted $C_6$ to $C_{20}$ aryl group, a substituted or unsubstituted $C_3$ to $C_{20}$ cycloalkyl group, a substituted or unsubstituted $C_2$ to $C_{20}$ heterocycloalkyl group, a substituted or unsubstituted $C_7$ to $C_{20}$ arylalkyl group, or a substituted or unsubstituted $C_3$ to $C_{20}$ heteroaryl group; and $R_5$ is a substituted or unsubstituted $C_1$ to $C_{10}$ alkyl group, a substituted or unsubstituted $C_6$ to $C_{20}$ aryl group, a substituted or unsubstituted $C_3$ to $C_{20}$ cycloalkyl group, a substituted or unsubstituted $C_2$ to $C_{20}$ heterocycloalkyl group, a substituted or unsubstituted $C_7$ to $C_{20}$ arylalkyl group, a substituted or unsubstituted $C_3$ to $C_{20}$ heteroaryl group, or a moiety represented by Formula 2:

<Formula 2>

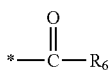

wherein, in Formula 2, * is a binding site to $N^-$ in Formula 1; and $R_6$ is a $C_1$ to $C_{10}$ alkyl group, a $C_6$ to $C_{20}$ aryl group, a $C_3$ to $C_{10}$ cycloalkyl group, or a $C_7$ to $C_{20}$ arylalkyl group.

2. The curing catalyst for epoxy resin compositions according to claim 1, wherein the curing catalyst is represented by Formula 3, <Formula 3>

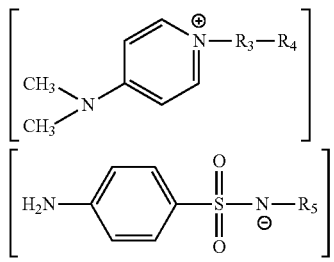

wherein, in Formula 3, $R_3$, $R_4$, and $R_5$ are defined in Formula 1.

3. The curing catalyst for epoxy resin compositions according to claim 1, wherein the curing catalyst is a compound represented by any one of Formulae 10 to 13, <Formula 10>

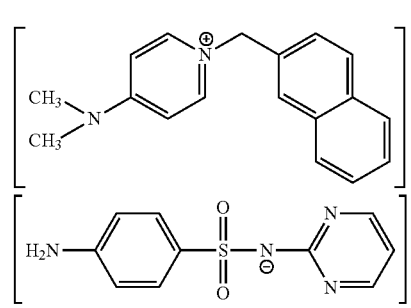

<Formula 11>

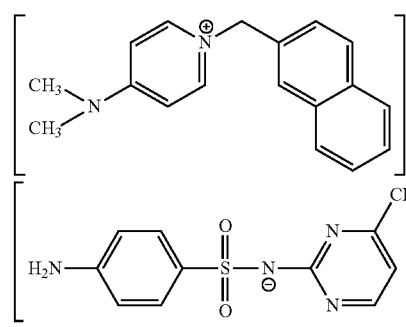

<Formula 12>

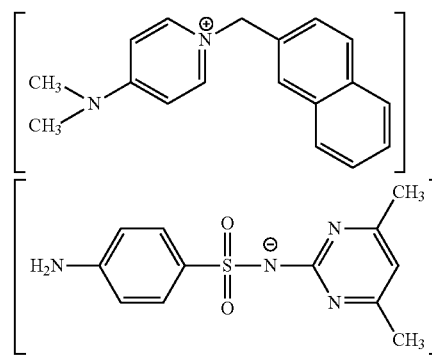

<Formula 13>

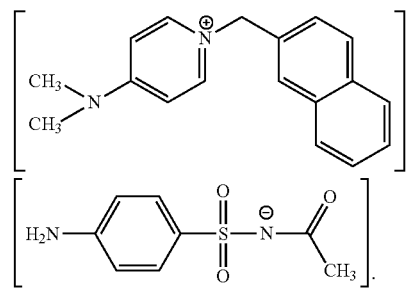

4. An epoxy resin composition, comprising: an epoxy resin, a curing agent, and a curing catalyst, wherein the curing catalyst includes the curing catalyst according to claim 1.

5. The epoxy resin composition according to claim 4, wherein the epoxy resin composition has a reaction initiation temperature of about 80° C. to less than about 110° C. and a maximum reaction temperature of about 100° C. to less than about 140° C., as measured by DSC measurement at a heating rate of about 10° C./min.

6. The epoxy resin composition according to claim 4, wherein the curing catalyst represented by Formula 1 is present in an amount of about 0.01 wt % to about 5 wt % in the epoxy resin composition in terms of solid content.

7. The epoxy resin composition according to claim 4, further comprising an inorganic filler.

8. An apparatus manufactured using the epoxy resin composition according to claim 4.

9. An epoxy resin composition for encapsulating a semiconductor device, the composition comprising an epoxy resin, a curing agent, a curing catalyst, and an inorganic filler, wherein the curing catalyst includes the curing catalyst according to claim 1.

* * * * *